(12) United States Patent
Waddington

(10) Patent No.: US 11,740,928 B2
(45) Date of Patent: Aug. 29, 2023

(54) IMPLEMENTING CRASH CONSISTENCY IN PERSISTENT MEMORY

(71) Applicant: International Business Machines Corporation, Armonk, NY (US)

(72) Inventor: Daniel Waddington, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 347 days.

(21) Appl. No.: 16/551,554

(22) Filed: Aug. 26, 2019

(65) Prior Publication Data

US 2021/0064415 A1    Mar. 4, 2021

(51) Int. Cl.
| | |
|---|---|
| *G06F 9/46* | (2006.01) |
| *G11C 11/4072* | (2006.01) |
| *G06F 12/0891* | (2016.01) |
| *G06F 12/0817* | (2016.01) |
| *G11C 11/409* | (2006.01) |

(52) U.S. Cl.
CPC .......... *G06F 9/467* (2013.01); *G06F 12/0828* (2013.01); *G06F 12/0891* (2013.01); *G11C 11/409* (2013.01); *G11C 11/4072* (2013.01)

(58) Field of Classification Search
CPC .. G06F 9/467; G06F 12/0828; G06F 12/0891; G11C 11/4072; G11C 11/409
See application file for complete search history.

(56) References Cited

U.S. PATENT DOCUMENTS

| | | | |
|---|---|---|---|
| 5,872,969 | A | 2/1999 | Copeland et al. |
| 6,272,607 | B1 | 8/2001 | Baentsch et al. |
| 7,168,010 | B2 | 1/2007 | Yadavalli et al. |
| 7,269,608 | B2 | 9/2007 | Wong et al. |
| 7,383,290 | B2 | 6/2008 | Mehra et al. |
| 7,856,423 | B1 | 12/2010 | Revsin |
| 8,984,239 | B2 | 3/2015 | Condit et al. |
| 8,990,533 | B1 | 3/2015 | Clark et al. |

(Continued)

OTHER PUBLICATIONS

Y. Lu, J. Shu and L. Sun, "Blurred persistence in transactional persistent memory," 2015 31st Symposium on Mass Storage Systems and Technologies (MSST), 2015, pp. 1-13, doi: 10.1109/MSST.2015.7208274. (Year: 2015).*

(Continued)

*Primary Examiner* — Prasith Thammavong
(74) *Attorney, Agent, or Firm* — Zilka-Kotab, P.C.

(57) ABSTRACT

A computer-implemented method according to one aspect includes receiving a request to perform a transaction in persistent memory; determining a correlation between volatile memory address locations in a volatile transaction cache and persistent memory locations in the persistent memory; performing the transaction within the volatile memory address locations of the volatile transaction cache; identifying modified volatile memory address locations in the volatile transaction cache that have been written during the transaction; logging, within the persistent memory, data within the modified volatile memory address locations; copying the data within the modified volatile memory address locations to corresponding persistent memory locations in the persistent memory, utilizing the determined correlation; and removing the logged data from the persistent memory, in response to determining that the copying has completed.

20 Claims, 6 Drawing Sheets

(56) References Cited

U.S. PATENT DOCUMENTS

| | | | |
|---|---|---|---|
| 9,547,594 B2 | 1/2017 | Willhalm | |
| 10,185,583 B1 | 1/2019 | Natanzon et al. | |
| 10,198,350 B2* | 2/2019 | Lee | G06F 12/0871 |
| 10,445,238 B1* | 10/2019 | Diestelhorst | G06F 9/4401 |
| 10,956,324 B1* | 3/2021 | Giles | G06F 9/3855 |
| 11,237,771 B1* | 2/2022 | Shveidel | G06F 3/065 |
| 2004/0030957 A1 | 2/2004 | Yadavalli et al. | |
| 2004/0111443 A1 | 6/2004 | Wong et al. | |
| 2005/0203974 A1 | 9/2005 | Smith et al. | |
| 2011/0191522 A1 | 8/2011 | Condict et al. | |
| 2014/0006701 A1 | 1/2014 | Condit et al. | |
| 2014/0237172 A1* | 8/2014 | Shah | G06F 12/0246 711/103 |
| 2014/0244952 A1 | 8/2014 | Raj et al. | |
| 2016/0034225 A1* | 2/2016 | Yoon | G06F 9/467 711/102 |
| 2016/0350216 A1 | 12/2016 | Shu et al. | |
| 2017/0177365 A1* | 6/2017 | Doshi | G06F 12/0891 |
| 2017/0344478 A1* | 11/2017 | Feng | G06F 9/467 |
| 2019/0278701 A1* | 9/2019 | Enz | G06F 12/0868 |
| 2020/0034310 A1* | 1/2020 | Drzewiecki | G06F 12/1036 |

OTHER PUBLICATIONS

J. Zhao, S. Li, D. H. Yoon, Y. Xie and N. P. Jouppi, "Kiln: Closing the performance gap between systems with and without persistence support," 2013 46th Annual IEEE/ACM International Symposium on Microarchitecture (MICRO), 2013, pp. 421-432. (Year: 2013).*

T. Wang, S. Sambasivam, Y. Solihin and J. Tuck, "Hardware Supported Persistent Object Address Translation," 2017 50th Annual IEEE/ACM International Symposium on Microarchitecture (MICRO), 2017, pp. 800-812. (Year: 2017).*

Ren et al., "ThyNVM: Enabling Software-Transparent Crash Consistency in Persistent Memory Systems," ACM, MICRO-48, Dec. 5-9, 2015, pp. 1-14.

Nalli et al., "An Analysis of Persistent Memory Use with Whisper," ACM, ASPLOS '17, Apr. 8-12, 2017, 14 pages.

Anonymous, "Persistent Memory Programming," pmem.io, accessed on Aug. 16, 2019, 4 pages, retrieved from https://pmem.io/pmdk/.

Coburn et al., "NV-Heaps: Making Persistent Objects Fast and Safe with Next-Generation, Non-Volatile Memories," ACM, ASPLOS '11, Mar. 5-11, 2011, 13 pages, retrieved from https://courses.engr.illinois.edu/ece598ms/sp2018/papers/paper44.pdf.

Lai et al., "Leave the Cache Hierarchy Operation as It Is: A New Persistent Memory Accelerating Approach," ACM, DAC '17, Jun. 18-22, 2017, 6 pages, retrieved from https://cseweb.ucsd.edu/~jzhao/files/persist-cache-dac2017.pdf.

Ni et al., "Reducing NVM Writes with Optimized Shadow Paging," HotStorage '18, Jul. 9-10, 2018, 6 pages, retrieved from https://www.usenix.org/node/216903.

Volos et al., "Mnemosyne: Lightweight Persistent Memory," ACM, ASPLOS '11, Mar. 5-11, 2011, 13 pages, retrieved from http://pages.cs.wisc.edu/~swift/papers/asplos11_mnemosyne.pdf.

Mohan et al., "ARIES: A Transaction Recovery Method Supporting Fine-Granularity Locking and Partial Rollbacks Using Write-Ahead Logging," ACM Transactions on Database Systems, vol. 17, No. 1, Mar. 1992, pp. 94-162.

Wei et al., "NICO: Reducing Software-Transparent Crash Consistency Cost for Persistent Memory," IEEE Transactions on Computers, vol. 68, No. 9, Sep. 2019, pp. 1313-1324.

* cited by examiner

IMPLEMENTING CRASH CONSISTENCY IN PERSISTENT MEMORY

BACKGROUND

The present invention relates to data storage and operations, and more specifically, this invention relates to implementing crash consistency for data being operated on in persistent memory.

Persistent memory is a rapidly advancing memory technology that provides more flexibility and higher capacity than flash memory. Crash consistency is a key component of persistent memory. However, current solutions for implementing crash consistency within persistent memory mandates the usage of rigid pre-defined data structures, which are inflexible and expensive to implement. There is therefore a need for a crash consistency implementation for persistent memory that has an adjustable granularity and that is flexible enough to be easily applied to legacy data structures.

SUMMARY

A computer-implemented method according to one aspect includes receiving a request to perform a transaction in persistent memory; determining a correlation between volatile memory address locations in a volatile transaction cache and persistent memory locations in the persistent memory; performing the transaction within the volatile memory address locations of the volatile transaction cache; identifying modified volatile memory address locations in the volatile transaction cache that have been written during the transaction; logging, within the persistent memory, data within the modified volatile memory address locations; copying the data within the modified volatile memory address locations to corresponding persistent memory locations in the persistent memory, utilizing the determined correlation; and removing the logged data from the persistent memory, in response to determining that the copying has completed.

In one aspect, the volatile transaction cache includes a pool of volatile memory that acts as a staging cache during the transaction.

In this way, crash consistency/checkpointing may be enabled for transactions in persistent memory. This crash consistency/checkpointing may ensure that data can be recovered in response to a system crash during the implementation of the transaction within the persistent memory.

According to another aspect, a computer program product for implementing crash consistency in persistent memory includes a computer readable storage medium having program instructions embodied therewith, where the computer readable storage medium is not a transitory signal per se, and where the program instructions are executable by a processor to cause the processor to perform a method including receiving, by the processor, a request to perform a transaction in persistent memory; determining, by the processor, a correlation between volatile memory address locations in a volatile transaction cache and persistent memory locations in the persistent memory; performing, by the processor, the transaction within the volatile memory address locations of the volatile transaction cache; identifying, by the processor, modified volatile memory address locations in the volatile transaction cache that have been written during the transaction; logging, by the processor within the persistent memory, data within the modified volatile memory address locations; copying, by the processor, the data within the modified volatile memory address locations to corresponding persistent memory locations in the persistent memory, utilizing the determined correlation; and removing, by the processor, the logged data from the persistent memory, in response to determining that the copying has completed.

In one aspect, the volatile transaction cache is implemented utilizing one or more instances of volatile memory.

In another aspect, a granularity of crash consistency/checkpointing may be adjusted by altering an amount of data that is logged before being transferred from the volatile transaction cache to the non-volatile persistent memory. This may enable the dynamic adjustment of transaction performance and recoverability, which may improve an overall performance of a computing device implementing such transactions. Further, legacy data structures may be easily integrated into crash consistent persistent memory.

According to another aspect, a system includes a processor; and logic integrated with the processor, executable by the processor, or integrated with and executable by the processor, where the logic is configured to: receive a request to perform a transaction in persistent memory; determine a correlation between volatile memory address locations in a volatile transaction cache and persistent memory locations in the persistent memory; perform the transaction within the volatile memory address locations of the volatile transaction cache; identify modified volatile memory address locations in the volatile transaction cache that have been written during the transaction; log, within the persistent memory, data within the modified volatile memory address locations; copy the data within the modified volatile memory address locations to corresponding persistent memory locations in the persistent memory, utilizing the determined correlation; and remove the logged data from the persistent memory, in response to determining that the copying has completed.

In one aspect, determining the correlation includes calculating an offset between bases of the volatile memory address locations in the volatile transaction cache and the persistent memory locations in the persistent memory.

In this way, any volatile memory address location in the volatile transaction cache may be translated to an equivalent persistent memory location in the persistent memory, utilizing the offset.

Other aspects and embodiments of the present invention will become apparent from the following detailed description, which, when taken in conjunction with the drawings, illustrate by way of example the principles of the invention.

DETAILED DESCRIPTION

Figure 1:
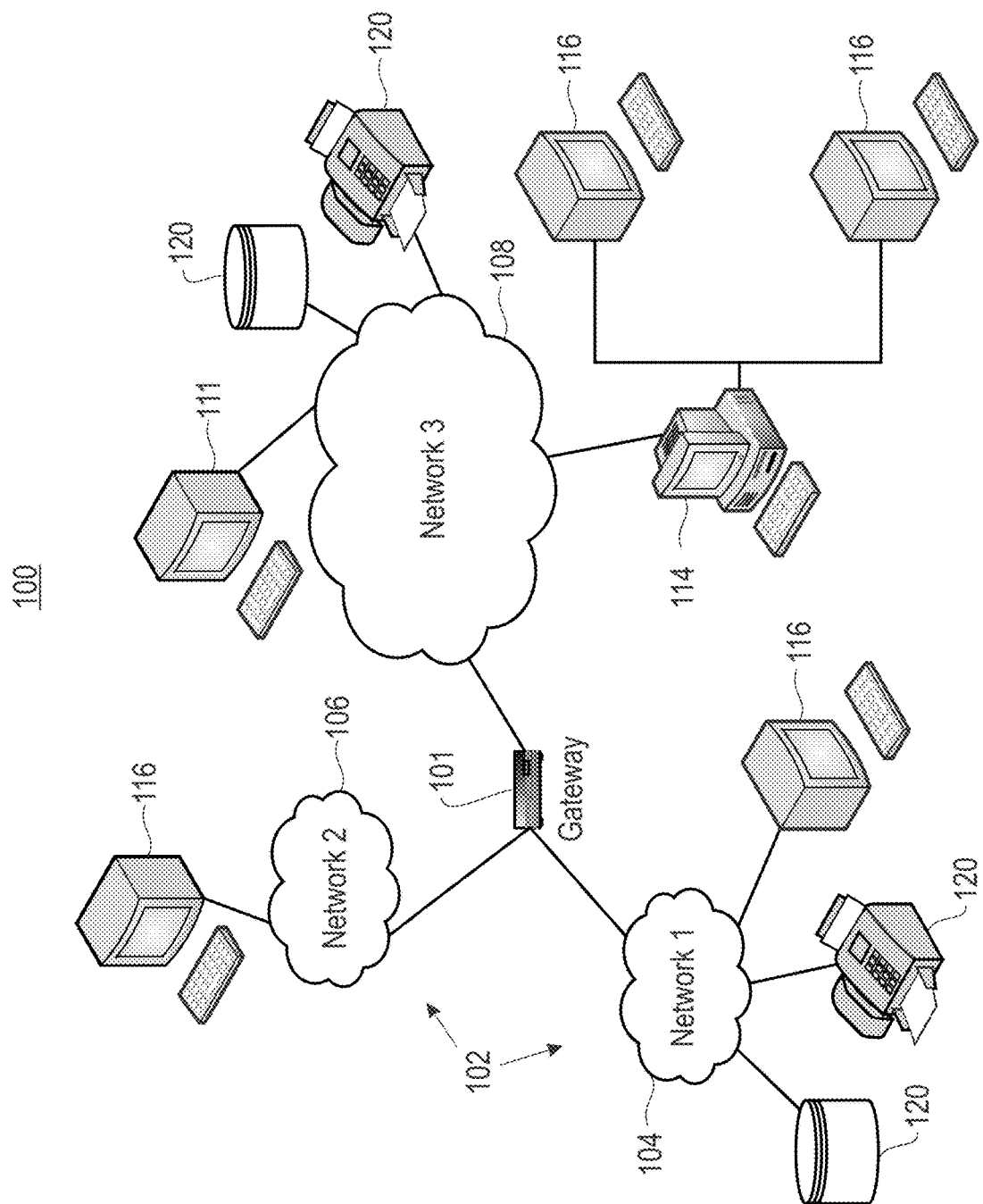
FIG. 1 illustrates a network architecture, in accordance with one aspect of the present invention.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "includes" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred aspects of systems, methods and computer program products for implementing crash consistency in persistent memory.

In one general aspect, a computer-implemented method includes receiving a request to perform a transaction in persistent memory; determining a correlation between volatile memory address locations in a volatile transaction cache and persistent memory locations in the persistent memory; performing the transaction within the volatile memory address locations of the volatile transaction cache; identifying modified volatile memory address locations in the volatile transaction cache that have been written during the transaction; logging, within the persistent memory, data within the modified volatile memory address locations; copying the data within the modified volatile memory address locations to corresponding persistent memory locations in the persistent memory, utilizing the determined correlation; and removing the logged data from the persistent memory, in response to determining that the copying has completed.

In another general aspect, a computer program product for implementing crash consistency in persistent memory includes a computer readable storage medium having program instructions embodied therewith, where the computer readable storage medium is not a transitory signal per se, and where the program instructions are executable by a processor to cause the processor to perform a method including receiving, by the processor, a request to perform a transaction in persistent memory; determining, by the processor, a correlation between volatile memory address locations in a volatile transaction cache and persistent memory locations in the persistent memory; performing, by the processor, the transaction within the volatile memory address locations of the volatile transaction cache; identifying, by the processor, modified volatile memory address locations in the volatile transaction cache that have been written during the transaction; logging, by the processor within the persistent memory, data within the modified volatile memory address locations; copying, by the processor, the data within the modified volatile memory address locations to corresponding persistent memory locations in the persistent memory, utilizing the determined correlation; and removing, by the processor, the logged data from the persistent memory, in response to determining that the copying has completed.

In another general aspect, a system includes a processor; and logic integrated with the processor, executable by the processor, or integrated with and executable by the processor, where the logic is configured to: receive a request to perform a transaction in persistent memory; determine a correlation between volatile memory address locations in a volatile transaction cache and persistent memory locations in the persistent memory; perform the transaction within the volatile memory address locations of the volatile transaction cache; identify modified volatile memory address locations in the volatile transaction cache that have been written during the transaction; log, within the persistent memory, data within the modified volatile memory address locations; copy the data within the modified volatile memory address locations to corresponding persistent memory locations in the persistent memory, utilizing the determined correlation; and remove the logged data from the persistent memory, in response to determining that the copying has completed.

FIG. 1 illustrates an architecture 100, in accordance with one aspect. As shown in FIG. 1, a plurality of remote networks 102 are provided including a first remote network 104 and a second remote network 106. A gateway 101 may be coupled between the remote networks 102 and a proximate network 108. In the context of the present architecture 100, the networks 104, 106 may each take any form including, but not limited to a LAN, a WAN such as the Internet, public switched telephone network (PSTN), internal telephone network, etc.

In use, the gateway 101 serves as an entrance point from the remote networks 102 to the proximate network 108. As such, the gateway 101 may function as a router, which is capable of directing a given packet of data that arrives at the gateway 101, and a switch, which furnishes the actual path in and out of the gateway 101 for a given packet.

Further included is at least one data server 114 coupled to the proximate network 108, and which is accessible from the remote networks 102 via the gateway 101. It should be noted that the data server(s) 114 may include any type of computing device/groupware. Coupled to each data server 114 is a plurality of user devices 116. User devices 116 may also be connected directly through one of the networks 104, 106, 108. Such user devices 116 may include a desktop computer, lap-top computer, hand-held computer, printer or any other type of logic. It should be noted that a user device 111 may also be directly coupled to any of the networks, in one aspect.

A peripheral 120 or series of peripherals 120, e.g., facsimile machines, printers, networked and/or local storage units or systems, etc., may be coupled to one or more of the networks 104, 106, 108. It should be noted that databases and/or additional components may be utilized with, or integrated into, any type of network element coupled to the networks 104, 106, 108. In the context of the present description, a network element may refer to any component of a network.

According to some approaches, methods and systems described herein may be implemented with and/or on virtual systems and/or systems which emulate one or more other systems, such as a UNIX system which emulates an IBM z/OS environment, a UNIX system which virtually hosts a MICROSOFT WINDOWS environment, a MICROSOFT WINDOWS system which emulates an IBM z/OS environment, etc. This virtualization and/or emulation may be enhanced through the use of VMWARE software, in some aspects.

In more approaches, one or more networks 104, 106, 108, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used.

Figure 2:
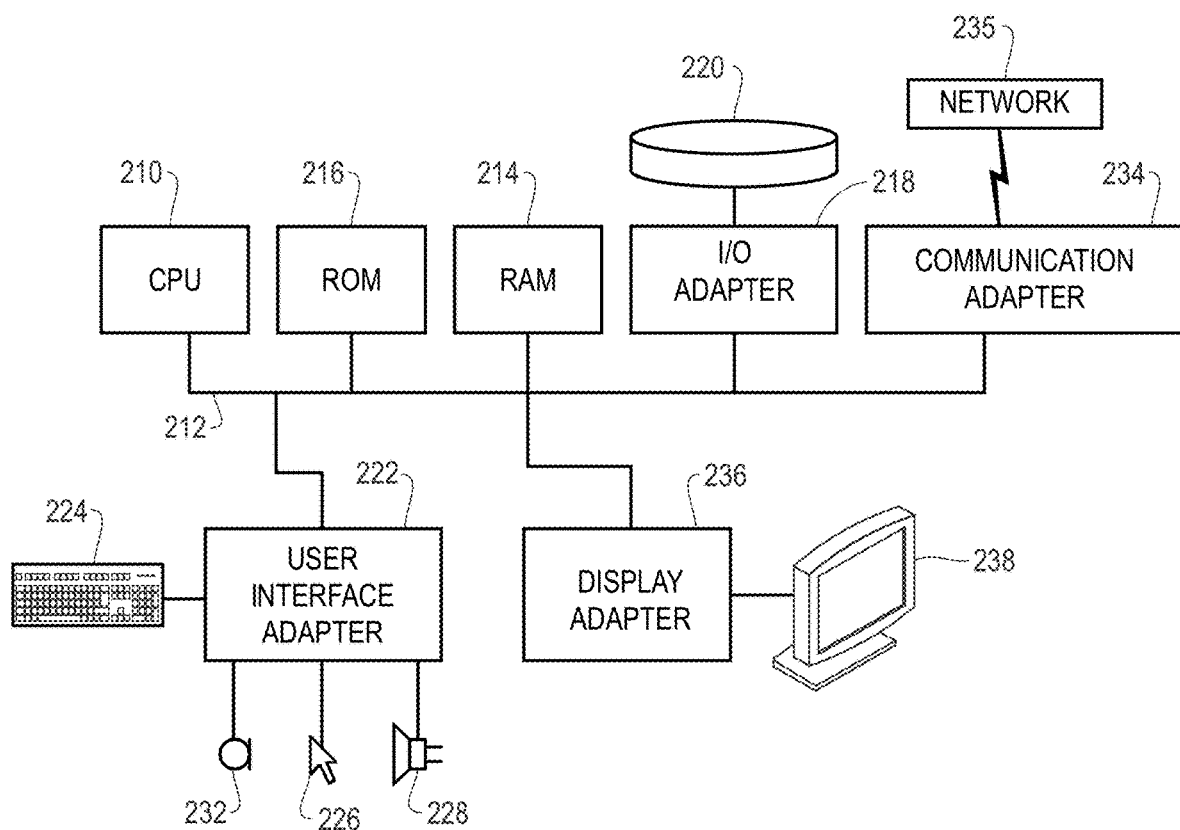
FIG. 2 shows a representative hardware environment that may be associated with the servers and/or clients of FIG. 1, in accordance with one aspect of the present invention.

FIG. 2 shows a representative hardware environment associated with a user device 116 and/or server 114 of FIG. 1, in accordance with one aspect. Such figure illustrates a typical hardware configuration of a workstation having a central processing unit 210, such as a microprocessor, and a number of other units interconnected via a system bus 212.

The workstation shown in FIG. 2 includes a Random Access Memory (RAM) 214, Read Only Memory (ROM) 216, an I/O adapter 218 for connecting peripheral devices such as disk storage units 220 to the bus 212, a user interface adapter 222 for connecting a keyboard 224, a mouse 226, a speaker 228, a microphone 232, and/or other user interface devices such as a touch screen and a digital camera (not shown) to the bus 212, communication adapter 234 for connecting the workstation to a communication network 235 (e.g., a data processing network) and a display adapter 236 for connecting the bus 212 to a display device 238.

The workstation may have resident thereon an operating system such as the Microsoft Windows® Operating System (OS), a MAC OS, a UNIX OS, etc. It will be appreciated that a preferred aspect may also be implemented on platforms and operating systems other than those mentioned. A preferred aspect may be written using XML, C, and/or C++ language, or other programming languages, along with an object oriented programming methodology. Object oriented programming (OOP), which has become increasingly used to develop complex applications, may be used.

Figure 3:
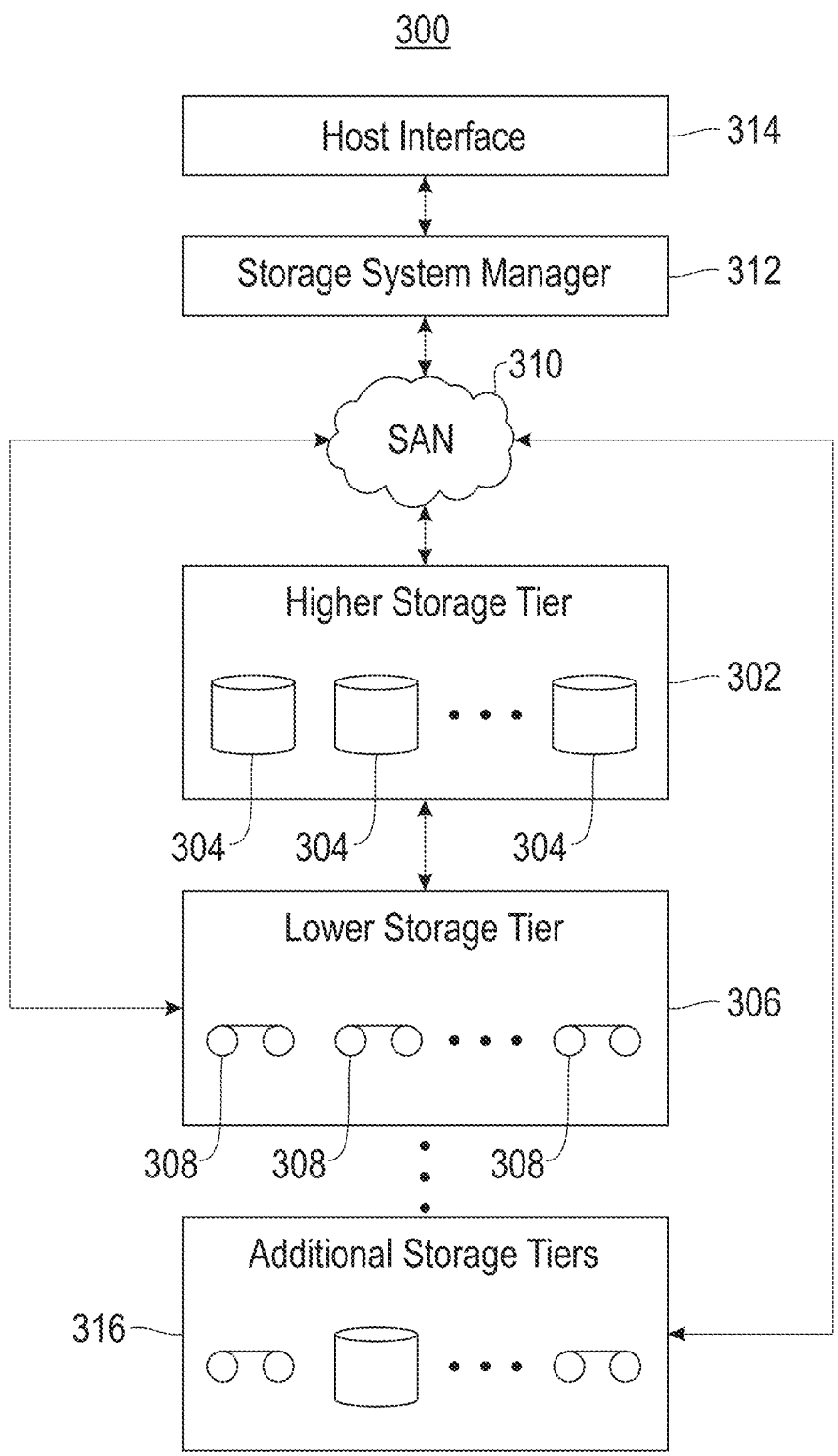
FIG. 3 illustrates a tiered data storage system in accordance with one aspect of the present invention.

Now referring to FIG. 3, a storage system 300 is shown according to one aspect. Note that some of the elements shown in FIG. 3 may be implemented as hardware and/or software, according to various aspects. The storage system 300 may include a storage system manager 312 for communicating with a plurality of media on at least one higher storage tier 302 and at least one lower storage tier 306. The higher storage tier(s) 302 preferably may include one or more random access and/or direct access media 304, such as hard disks in hard disk drives (HDDs), nonvolatile memory (NVM), solid state memory in solid state drives (SSDs), flash memory, SSD arrays, flash memory arrays, etc., and/or others noted herein or known in the art. The lower storage tier(s) 306 may preferably include one or more lower performing storage media 308, including sequential access media such as magnetic tape in tape drives and/or optical media, slower accessing HDDs, slower accessing SSDs, etc., and/or others noted herein or known in the art. One or more additional storage tiers 316 may include any combination of storage memory media as desired by a designer of the system 300. Also, any of the higher storage tiers 302 and/or the lower storage tiers 306 may include some combination of storage devices and/or storage media.

The storage system manager 312 may communicate with the storage media 304, 308 on the higher storage tier(s) 302 and lower storage tier(s) 306 through a network 310, such as a storage area network (SAN), as shown in FIG. 3, or some other suitable network type. The storage system manager 312 may also communicate with one or more host systems (not shown) through a host interface 314, which may or may not be a part of the storage system manager 312. The storage system manager 312 and/or any other component of the storage system 300 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more aspects, the storage system 300 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 302, may include a majority of SSD storage media for storing data in a higher performing storage environment, and remaining storage tiers, including lower storage tier 306 and additional storage tiers 316 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 302, while data not having one of these attributes may be stored to the additional storage tiers 316, including lower storage tier 306. Of course, one of skill in the art, upon reading the present descriptions, may devise many other combinations of storage media types to implement into different storage schemes, according to the aspects presented herein.

According to some aspects, the storage system (such as 300) may include logic configured to receive a request to open a data set, logic configured to determine if the requested data set is stored to a lower storage tier 306 of a tiered data storage system 300 in multiple associated portions, logic configured to move each associated portion of the requested data set to a higher storage tier 302 of the tiered data storage system 300, and logic configured to assemble the requested data set on the higher storage tier 302 of the tiered data storage system 300 from the associated portions.

Of course, this logic may be implemented as a method on any device and/or system or as a computer program product, according to various aspects.

Figure 4:
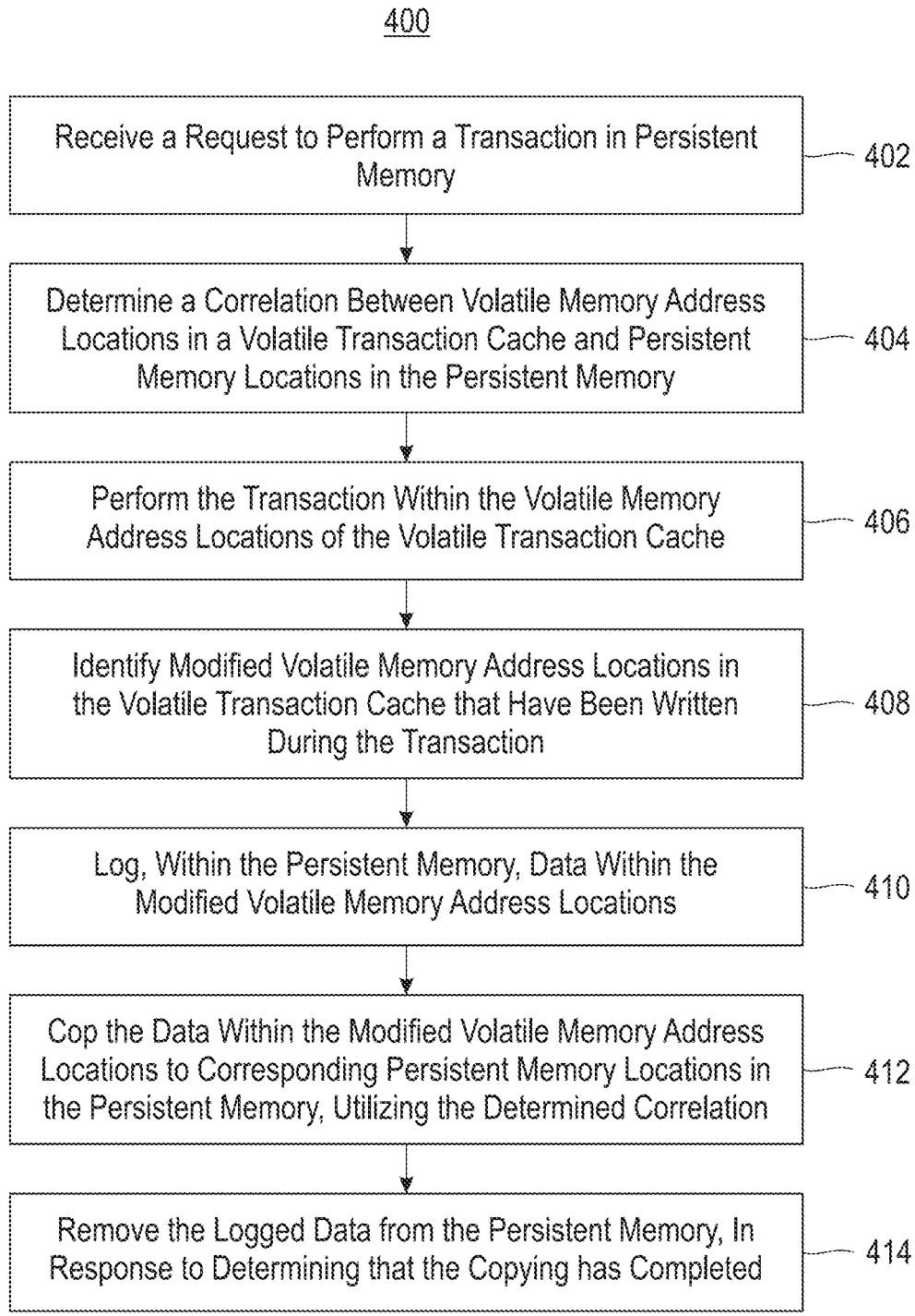
FIG. 4 illustrates a method for implementing crash consistency in persistent memory, in accordance with one aspect of the present invention.

Now referring to FIG. 4, a flowchart of a method 400 is shown according to one aspect. The method 400 may be performed in accordance with the present invention in any of the environments depicted in FIGS. 1-3 and 5, among others, in various aspects. Of course, greater or fewer operations than those specifically described in FIG. 4 may be included in method 400, as would be understood by one of skill in the art upon reading the present descriptions.

Each of the steps of the method 400 may be performed by any suitable component of the operating environment. For example, in various aspects, the method 400 may be partially or entirely performed by one or more servers, computers, or some other device having one or more processors therein. The processor, e.g., processing circuit(s), chip(s), and/or module(s) implemented in hardware and/or software, and preferably having at least one hardware component may be utilized in any device to perform one or more steps of the method 400. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 4, method 400 may initiate with operation 402, where a request to perform a transaction in persistent memory is received. In one aspect, the transaction may include one or more operations to be performed on data.

For example, the transaction may include the modification of data currently stored within the persistent memory. In another example, the transaction may include the removal of data currently stored within the persistent memory. In yet another example, the transaction may include the creation of data within the persistent memory.

Additionally, in one aspect, the request may be received from an application within a computing system. In another aspect, the persistent memory may include non-volatile memory such as 3D Xpoint (3DXP) memory, resistive random-access memory (ReRAM), Spin-Transfer Torque MRAM (STT-MRAM), ferroelectric RAM (FeRAM), nano-ram (NRAM), etc. In yet another aspect, the persistent memory may include one or more hard disk drives, one or more solid-state drives, one or more tape drives, etc.

Further, method 400 may proceed with operation 404, where a correlation between volatile memory address locations in a volatile transaction cache and persistent memory locations in the persistent memory is determined. In one aspect, the correlation may be determined in response to the request to perform the transaction. In another aspect, the volatile transaction cache may include a pool of volatile memory that acts as a staging cache during the transaction.

Further still, in one aspect, the volatile transaction cache may be implemented utilizing one or more instances of volatile memory, one or more instances of non-volatile memory, etc. For example, the volatile memory may include central processing unit (CPU) data cache memory such as level-1 (L1) cache memory, level-2 (L2) cache memory, level-3 (L3) cache memory. In another example, the volatile memory may include dynamic random-access memory (DRAM), such as explicitly paged DRAM.

Also, in one aspect, a virtual address space may be created within the volatile transaction cache. In another aspect, the virtual address space may be mapped to a region of persistent memory. For example, if the transaction includes a data write to the volatile memory, a region of volatile memory may be allocated and mapped to the virtual address space within the volatile transaction cache. In another example, if the transaction includes a modification of existing data within the persistent memory, a region of persistent memory where the existing data is located may be identified and mapped to the virtual address space within the volatile transaction cache, whereby data is copied from the persistent memory to the volatile transaction cache.

In addition, in one aspect, determining the correlation may include calculating an offset between the bases of the volatile memory address locations in the volatile transaction cache and the persistent memory locations in the persistent memory. For example, the volatile memory address locations in the volatile transaction cache may start at address 100, and the persistent memory locations in the persistent memory may start at address 1000. The offset may be calculated as the difference between the starting addresses (e.g., 1000−100=900).

In this way, any volatile memory address location in the volatile transaction cache may be translated to an equivalent persistent memory location in the persistent memory, utilizing the offset.

Furthermore, method 400 may proceed with operation 406, where the transaction is performed within the volatile memory address locations of the volatile transaction cache. In one aspect, data associated with the transaction (e.g., data to be read and/or modified by the transaction, etc.) may be transferred from the persistent memory to the volatile transaction cache (e.g., to be operated on by the transaction, etc.). In another aspect, the associated data may be transferred into one or more volatile memory address locations of the volatile transaction cache from one or more corresponding persistent memory locations in the persistent memory.

Further still, in one aspect, the associated data may be transferred into the volatile transaction cache in response to a page fault. In another aspect, operations indicated within the transaction may then be performed on the data transferred to the volatile transaction cache.

Also, method 400 may proceed with operation 408, where modified volatile memory address locations that have been written during the transaction are located in the volatile transaction cache. In one aspect, the data associated with the transaction may be arranged within a data structure. In another aspect, the data structure may include a tracking data structure that identifies and records volatile memory address locations of the volatile transaction cache that are modified by operations performed during the transaction. For example, these volatile memory address locations of the volatile transaction cache that are written may be identified as modified volatile memory address locations.

Additionally, in one aspect, a page table may be utilized to determine pages that have been modified, and volatile memory address locations of the volatile transaction cache corresponding to these pages may be marked as modified volatile memory address locations.

Further, method 400 may proceed with operation 410, where data within the modified volatile memory address locations is logged within the persistent memory. In one aspect, logging the data may include copying the data within the modified volatile memory address locations of the volatile transaction cache to one or more locations within the persistent memory. For example, the data within the modified volatile memory address locations may be copied from the volatile transaction cache to an undo or redo log within the persistent memory. In another example, the undo or redo log may therefore contain a persistent copy of changes made to the data that are to be implemented within the persistent memory.

Further still, in one aspect, the undo or redo log may be implemented within a persistent storage device such as a hard disk drive, or a region of memory that is explicitly flushed (and therefore persistent). For example, the undo or redo log may be located within different persistent storage than the modified volatile memory address locations. In another aspect, logging the data in the persistent memory may enable crash consistency for the transaction. In yet another aspect, the undo or redo log may be implemented using a type of persistent/non-volatile memory that is fast but has a small capacity. For example, for 3D X Point (3DXP), MRAM may be used as an undo log memory.

Also, method 400 may proceed with operation 412, where the data within the modified volatile memory address locations is copied to corresponding persistent memory locations in the persistent memory, utilizing the determined correlation. In one aspect, the calculated offset may be applied to the modified volatile memory address locations to determine the corresponding persistent memory locations to be modified. In another aspect, the data stored within the modified volatile memory address locations may then be copied to the corresponding persistent memory locations within the persistent memory. If there is a system crash or other error during the copy, the undo or redo log may be used to restore the data to a state before or after the transaction.

In addition, method 400 may proceed with operation 414, where the logged data is removed from the persistent memory, in response to determining that the copying has completed. In one aspect, removing the logged data may include deleting the undo or redo log from the persistent memory. In another aspect, the volatile memory address locations in the volatile transaction cache may also be unmapped in response to determining that the copying has completed.

In this way, crash consistency/checkpointing may be enabled for transactions in persistent memory. This crash consistency/checkpointing may ensure that data can be recovered in response to a system crash during the implementation of the transaction within the persistent memory. Additionally, a granularity of such crash consistency/checkpointing may be adjusted by altering an amount of data that is logged before being transferred from the volatile transaction cache to the non-volatile persistent memory. This may enable the dynamic adjustment of transaction performance and recoverability, which may improve an overall performance of a computing device implementing such transactions. Further, legacy data structures may be easily integrated into crash consistent persistent memory.

Also, a write performance of the persistent memory may be improved as a result of amortizing overlapping operations to modified volatile memory address locations in the volatile transaction cache.

Figure 5:
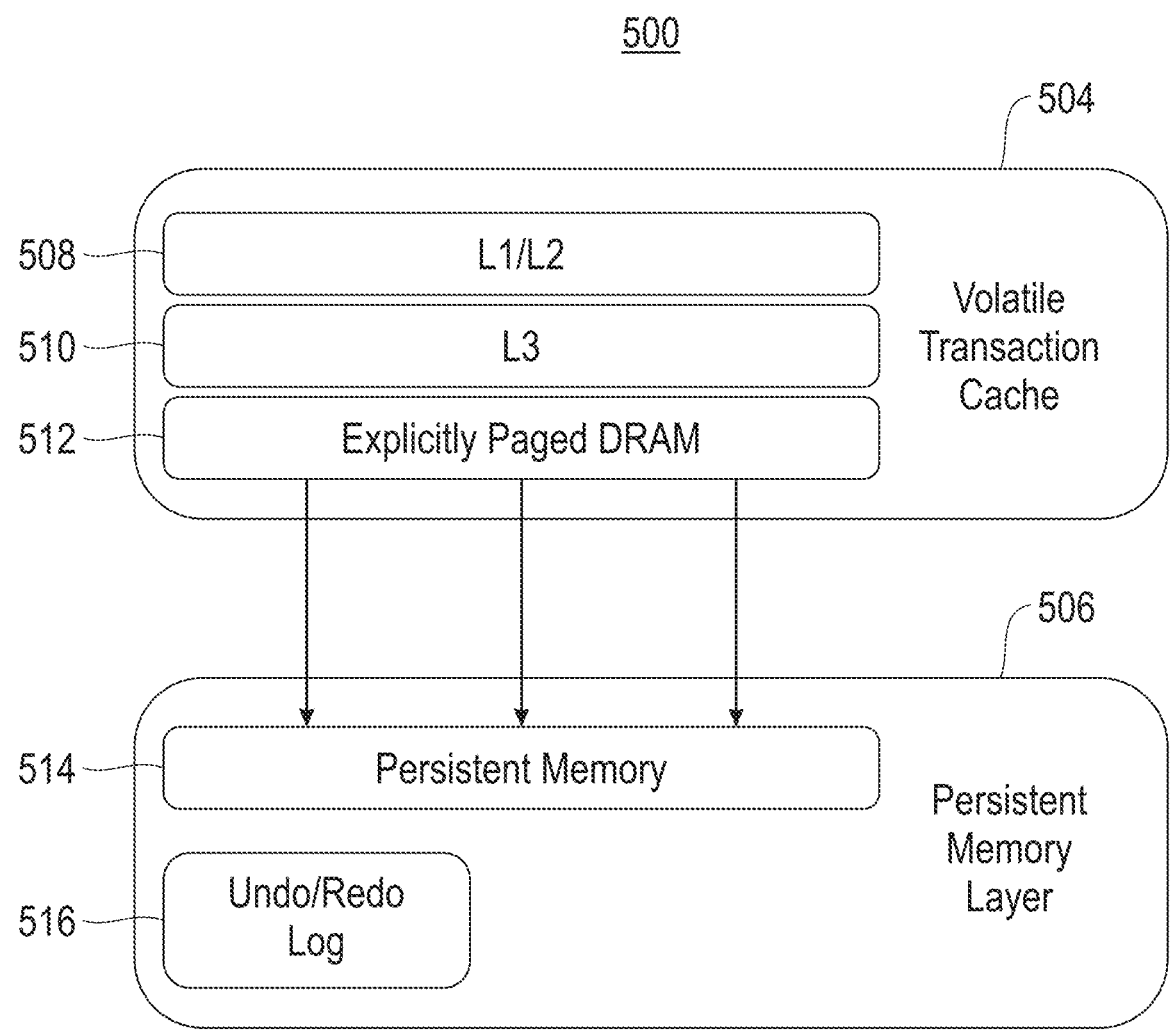
FIG. 5 illustrates an exemplary crash-consistent memory implementation, in accordance with one aspect of the present invention.

FIG. 5 illustrates an exemplary crash consistent memory implementation 500, according to one exemplary aspect. As shown, a volatile transaction cache 504 is in communication with a persistent memory layer 506. The persistent memory layer 506 includes persistent memory 514 such as one or more instances of non-volatile memory, hard disk drives, etc. The persistent memory layer 506 also includes an undo or redo log 516, which is logically separate from the persistent memory 514 but may be implemented utilizing hardware found within the persistent memory 514.

Additionally, the volatile transaction cache 504 includes an L1/L2 cache 508, and L3 cache 510, and explicitly paged DRAM 512. In one aspect, the volatile memory within the volatile transaction cache 504 may be used as a staging cache to facilitate crash consistency during transactions to the persistent memory 514.

For example, in response to a request to perform a transaction within the persistent memory 514, volatile memory address locations in the volatile transaction cache 504 may be correlated to persistent memory locations in the persistent memory 514. Additionally, the requested transaction may first be performed within the volatile memory address locations of the volatile transaction cache 504.

Further, modified volatile memory address locations in the volatile transaction cache 504 that have been written during the transaction may be identified, and data within those modified volatile memory address locations may be logged within the undo or redo log 516. Further still, the data within the modified volatile memory address locations of the volatile transaction cache 504 may be copied to corresponding persistent memory locations in the persistent memory 514, utilizing the determined correlation between volatile memory address locations in the volatile transaction cache 504 and persistent memory locations in the persistent memory 514.

Also, in response determining that the copying of the data within the modified volatile memory address locations of the volatile transaction cache 504 to corresponding persistent memory locations in the persistent memory 514 is successful, the undo or redo log 516 may be deleted or cleared.

In this way, the volatile transaction cache 504 may hold an inconsistent state between consistent state snapshots according to a predefined transaction granularity/interval. Additionally, transaction performance and recoverability may be dynamically adjusted, utilizing the volatile transaction cache 504.

Figure 6:
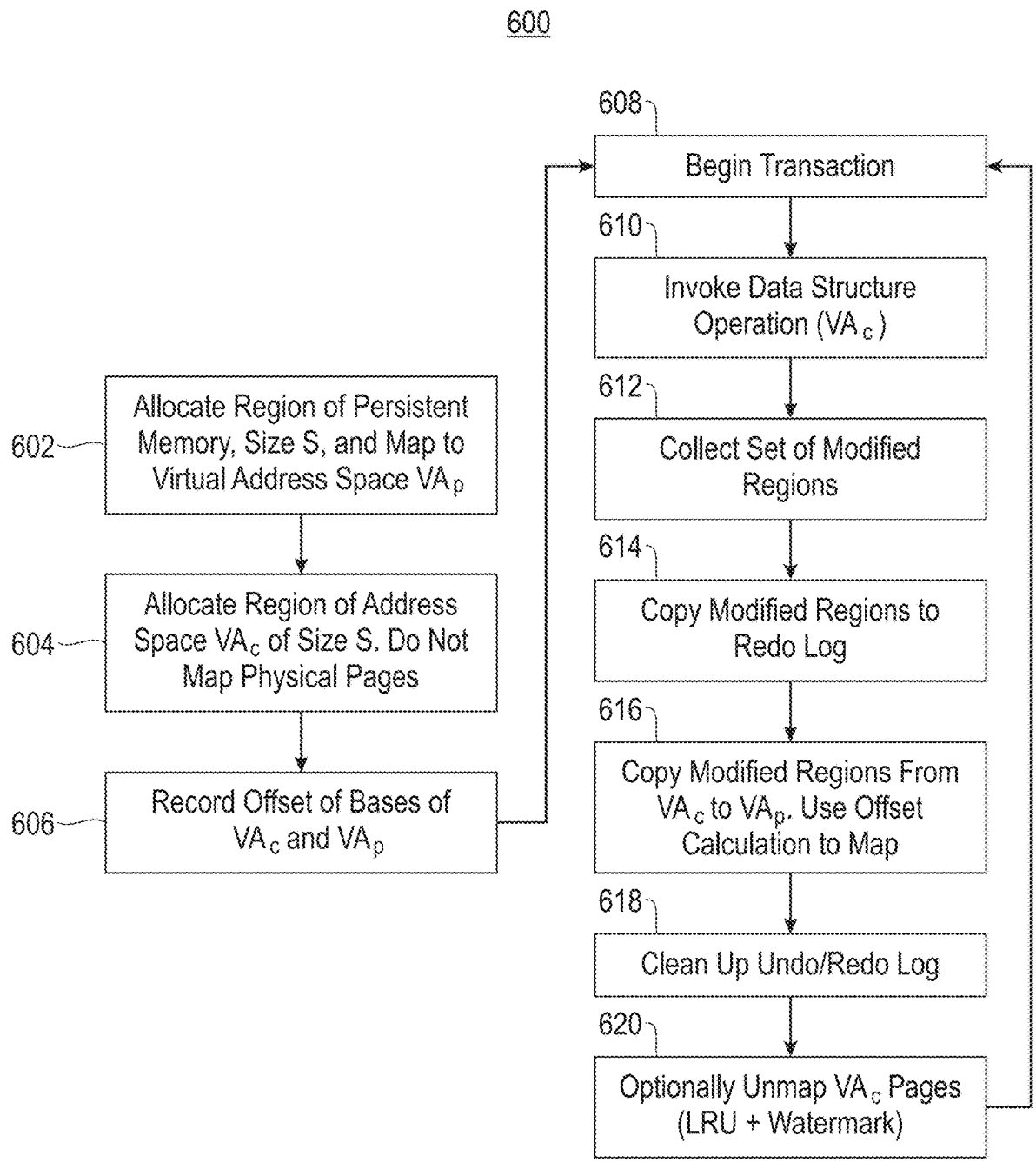
FIG. 6 illustrates a method for supporting crash consistency in persistent memory with a controlled granularity, in accordance with one aspect of the present invention.

Now referring to FIG. 6, a flowchart of a method 600 for supporting crash consistency in persistent memory with a controlled granularity is shown according to one aspect. The method 600 may be performed in accordance with the present invention in any of the environments depicted in FIGS. 1-3 and 5, among others, in various aspects. Of course, greater or fewer operations than those specifically described in FIG. 6 may be included in method 600, as would be understood by one of skill in the art upon reading the present descriptions.

Each of the steps of the method 600 may be performed by any suitable component of the operating environment. For example, in various aspects, the method 600 may be partially or entirely performed by one or more servers, computers, or some other device having one or more processors therein. The processor, e.g., processing circuit(s), chip(s), and/or module(s) implemented in hardware and/or software, and preferably having at least one hardware component may be utilized in any device to perform one or more steps of the method 600. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 6, method 600 may initiate with operation 602, where a region of persistent memory having a size S is allocated and mapped to a virtual address space VAp. Additionally, method 600 may proceed with operation 604, where a region of address space VAc having size S is allocated. Physical pages are not mapped. In one aspect, physical pages may be mapped if sufficient resources exist, or if pre-fetching or prediction is being implemented.

Additionally, method 600 may proceed with operation 606, where an offset between the bases of VAc and VAp is determined. Further, method 600 may proceed with operation 608, where the transaction is begun. Further still, method 600 may proceed with operation 610, where a data structure operation is invoked on VAc. The invoke operation may include a constructor execution.

Also, method 600 may proceed with operation 612, where a set of modified regions is collected. In addition, method 600 may proceed with operation 614, where the modified regions are copied to an undo or redo log. In this way, crash recovery is available if needed. Furthermore, method 600 may proceed with operation 616, where the modified regions are copied from VAc to VAp. The earlier calculated offset is used to map this copy.

Further still, method 600 may proceed with operation 618, where the undo or redo log is cleaned up. Optionally, in operation 620 VAc pages (e.g., an LRU and watermark) may be unmapped.

Method to Support Crash Consistency in Persistent Memory with Controlled Granularity Persistent memory, attached to the memory bus, is imminent technology with the advent of Intel's 3DXP-based Optane DC Persistent Memory product launch. Persistent memory may be positioned as main memory below caches. The system may either implicitly (e.g., via cache line eviction) or explicitly flush (e.g., through instruction execution) from the cache to persistent memory.

Using the "persistence" attribute of persistent memory requires that data structures and manipulation of data be crash consistent. One problem to be solved includes adjusting legacy data structures to enable crash consistent persistency in an efficient manner.

In one aspect, a method is provided to perform transactions on persistent memory. An amortization of writes is implemented into higher-performance volatile memory. This enables the adoption of legacy data structures.

Exemplary Implementation

In one aspect, DRAM with explicitly controlled paging is used as a transaction cache. It may be assumed that assume a number of DRAM pages is significantly less than a number of persistent memory pages. A paging policy may be moved out of the kernel into the application (e.g., utilizing SEGV handling with unmap). In another aspect, DRAM may only hold a partial view of the data structure.

Additionally, in one aspect, the persistent memory may hold a consistent (shadow) view of the complete data structure. At each transactional boundary (e.g., after a predetermined number of predefined transactions have been performed, etc.), modified regions of DRAM are explicitly flushed to the persistent memory. Prior to the flushing of the modified regions, regions are written to an undo or redo log in persistent memory. This technique allows for a checkpointing granularity to be adjusted and allows for the amortization of slower persistent memory writes.

Further, in one aspect, DRAM pages are "unmapped" outside of transaction boundaries. For example, mapped DRAM pages may include a number of pages that are impacted by a transaction. The transaction may be limited to page-level touches, which is less than the number of available DRAM pages. If a transaction exceeds a number of available DRAM pages, the transaction must be staged, which creates more overhead.

Page-Fault Sequence

In one aspect, a virtual address space may be allocated for the transaction cache without mapping physical pages (i.e. there is no memory per se, only address space). The address space may include a contiguous region of virtual addresses. The pages are fixed in size (e.g., 4K, 2 MB, 1 GB, etc.). An address space example is 0x1000->0x4000 (which includes four 4K pages).

When a program executes a load or store to an address (e.g., 0x10ff), then the CPU performs a lookup in the TLB cache for an existing mapping from a virtual to a physical address (at a cache line granularity). If no mapping exists, the CPU traverses the page-table for a mapping. If no mapping exists in the page table, a page-fault occurs. The kernel typically handles the page fault, which then allocates a physical page, and creates a page-table entry for the new mapping.

A page-fault on the transaction cache requires that not only a physical page is allocated, but that the "corresponding" data from the persistent memory is copied into the physical page before returning to the application.

Tracking Data Structures

In one aspect, modified regions from a transaction/operation may be collected on a legacy data structure. For example, existing data structure operations (functions) may be instrumented with calls that register a memory region (address and length) as modified when it is executed.

In another aspect, a modification set may be maintained in a range tree that coalesces ranges. In another aspect, thread-local storage may be used, and multiple threads may be combined at the end of the transaction. Legacy data structures can be instrumented by hand or automatically using static code analysis and transformation. Modified regions are coalesced to prevent replica flushes and to allow optimization (e.g., non-temporal writes of complete cache lines).

Persistent data structures do not "determine" the transaction boundary. The above implementations allow checkpointing at arbitrary points in time providing sufficient DRAM pages are available. This makes it easier to adopt legacy data structures through simple instrumentation, and the result is better performance and improved technology adoption. Unlike database transactions, the above implementations generalize to any data structure and computation.

In one aspect, a tradeoff may be made between rebuild time with transaction overhead by eliminating the persistent memory shadow copy and only using a log (e.g., a log to NVMe or other storage device, etc.). In another aspect, a page-table (dirty bits) can be used to track page modifications on data structures without any change to legacy code. In yet another aspect, a maximum number of DRAM pages for a transaction may be determinable through static analysis. In still another aspect, a transaction cache can use transparently paged (Memory Mode) persistent memory where hardware pages DRAM-to-persistent memory.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some aspects, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to aspects of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various aspects may include a processor and logic integrated with and/or executable by the processor, the logic being configured to perform one or more of the process steps recited herein. The processor may be of any configuration as described herein, such as a discrete processor or a processing circuit that includes many components such as processing hardware, memory, I/O interfaces, etc. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that aspects of the present invention may be provided in the form of a service deployed on behalf of a customer to offer service on demand.

The descriptions of the various aspects of the present invention have been presented for purposes of illustration, but are not intended to be exhaustive or limited to the aspects disclosed. Many modifications and variations will be apparent to those of ordinary skill in the art without departing from the scope and spirit of the described aspects. The terminology used herein was chosen to best explain the principles of the aspects, the practical application or technical improvement over technologies found in the marketplace, or to enable others of ordinary skill in the art to understand the aspects disclosed herein.

What is claimed is:

1. A computer-implemented method, comprising:
    receiving a request to modify data currently stored in persistent memory;
    determining a correlation between volatile memory address locations in a volatile transaction cache and persistent memory locations in the persistent memory, including calculating an offset between the volatile memory address locations in the volatile transaction cache and persistent memory locations in the persistent memory;

transferring data associated with the request from a plurality of persistent memory locations within the persistent memory to a plurality of corresponding volatile memory address locations within the volatile transaction cache, utilizing the determined correlation;

performing the requested modification on the transferred data within the volatile memory address locations of the volatile transaction cache;

identifying modified volatile memory address locations in the volatile transaction cache that have been written during the requested modification;

copying data within the modified volatile memory address locations to a log within the persistent memory;

copying the data within the modified volatile memory address locations to corresponding persistent memory locations in the persistent memory, utilizing the determined correlation; and removing the logged data from the persistent memory, in response to determining that the copying has completed.

2. The computer-implemented method of claim 1, wherein the offset between the volatile memory address locations in the volatile transaction cache and the persistent memory locations in the persistent memory includes a difference between a first starting address of the volatile memory address locations in the volatile transaction cache and a second starting address of the persistent memory locations in the persistent memory.

3. The computer-implemented method of claim 1, wherein the calculated offset is applied to the modified volatile memory address locations to determine the corresponding persistent memory locations to be modified.

4. The computer-implemented method of claim 1, wherein the correlation, including the offset, is determined in response to the request to modify the data.

5. The computer-implemented method of claim 1, wherein the data within the modified volatile memory address locations is copied to the corresponding persistent memory locations in the persistent memory, utilizing the calculated offset.

6. The computer-implemented method of claim 1, wherein, of the data associated with the request, only the data within the modified volatile memory address locations is copied to corresponding persistent memory locations.

7. The computer-implemented method of claim 1, wherein a virtual address space is created within the volatile transaction cache, and is mapped to a region of persistent memory.

8. The computer-implemented method of claim 1, comprising amortizing overlapping operations to the volatile memory address locations in the volatile transaction cache.

9. The computer-implemented method of claim 1, wherein the data associated with the request is transferred from the plurality of persistent memory locations within the persistent memory to the plurality of corresponding volatile memory address locations within the volatile transaction cache in response to a page fault.

10. The computer-implemented method of claim 1, wherein the data associated with the request is arranged within a data structure, where the data structure includes a tracking data structure that identifies and records volatile memory address locations of the volatile transaction cache that are written by operations performed during the modification of the data.

11. The computer-implemented method of claim 1, wherein a page table is utilized to determine pages that have been modified during the requested modification, and volatile memory address locations of the volatile transaction cache corresponding to these pages are marked as modified volatile memory address locations.

12. The computer-implemented method of claim 1, wherein the data within the modified volatile memory address locations is copied from the volatile transaction cache to an undo or redo log within the persistent memory.

13. The computer-implemented method of claim 1, wherein the calculated offset is applied to modified volatile memory address locations to determine corresponding persistent memory locations to be modified.

14. The computer-implemented method of claim 1, wherein removing the logged data includes deleting an undo or redo log from the persistent memory.

15. A computer program product comprising one or more computer readable storage media, and program instructions collectively stored on the one or more computer readable storage media, the program instructions comprising instructions configured to cause one or more processors to perform a method comprising:

receiving, by the one or more processors, a request to modify data currently stored in persistent memory;

determining, by the one or more processors, a correlation between volatile memory address locations in a volatile transaction cache and persistent memory locations in the persistent memory, including calculating, by the one or more processors, an offset between the volatile memory address locations in the volatile transaction cache and persistent memory locations in the persistent memory;

transferring, by the one or more processors, data associated with the request from a plurality of persistent memory locations within the persistent memory to a plurality of corresponding volatile memory address locations within the volatile transaction cache, utilizing the determined correlation;

performing, by the one or more processors, the requested modification on the transferred data within the volatile memory address locations of the volatile transaction cache;

identifying, by the one or more processors, modified volatile memory address locations in the volatile transaction cache that have been written during the requested modification;

copying, by the one or more processors, data within the modified volatile memory address locations to a log within the persistent memory;

copying, by the one or more processors, the data within the modified volatile memory address locations to corresponding persistent memory locations in the persistent memory, utilizing the determined correlation; and removing, by the one or more processors, the logged data from the persistent memory, in response to determining that the copying has completed.

16. The computer program product of claim 15, wherein the offset between the volatile memory address locations in the volatile transaction cache and the persistent memory locations in the persistent memory includes a difference between a first starting address of the volatile memory address locations in the volatile transaction cache and a second starting address of the persistent memory locations in the persistent memory.

17. The computer program product of claim 15, wherein the modification of the data includes a removal of data currently stored within the persistent memory.

18. The computer program product of claim 15, wherein the correlation is determined in response to the request to perform the modification of the data, wherein the data within the modified volatile memory address locations is copied to the corresponding persistent memory locations in the persistent memory, utilizing the calculated offset.

19. The computer program product of claim 15, wherein the volatile transaction cache includes a pool of volatile memory that acts as a staging cache during the modification of the data.

20. A system, comprising:
a processor; and
logic integrated with the processor, executable by the processor, or integrated with and executable by the processor, the logic being configured to:
receive a request to modify data currently stored in persistent memory;
determine a correlation between volatile memory address locations in a volatile transaction cache and persistent memory locations in the persistent memory, including calculating an offset between the volatile memory address locations in the volatile transaction cache and persistent memory locations in the persistent memory;
transfer data associated with the request from a plurality of persistent memory locations within the persistent memory to a plurality of corresponding volatile memory address locations within the volatile transaction cache, utilizing the determined correlation;
perform the requested modification on the transferred data within the volatile memory address locations of the volatile transaction cache;
identify modified volatile memory address locations in the volatile transaction cache that have been written during the requested modification;
copy data within the modified volatile memory address locations to a log within the persistent memory;
copy the data within the modified volatile memory address locations to corresponding persistent memory locations in the persistent memory, utilizing the determined correlation; and
remove the logged data from the persistent memory, in response to determining that the copying has completed.

\* \* \* \* \*